United States Patent
Cooney

(10) Patent No.: US 11,160,184 B2
(45) Date of Patent: Oct. 26, 2021

(54) VEHICLE CIRCUIT CARD ASSEMBLY

(71) Applicant: Hamilton Sundstrand Corporation, Charlotte, NC (US)

(72) Inventor: Robert C. Cooney, Janesville, WI (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 90 days.

(21) Appl. No.: 16/595,795

(22) Filed: Oct. 8, 2019

(65) Prior Publication Data

US 2021/0105907 A1 Apr. 8, 2021

(51) Int. Cl.
*H05K 7/14* (2006.01)
*H01R 12/70* (2011.01)
*H01R 13/631* (2006.01)

(52) U.S. Cl.
CPC ....... *H05K 7/1404* (2013.01); *H01R 12/7005* (2013.01); *H01R 13/631* (2013.01); *H05K 7/1418* (2013.01); *H05K 7/1461* (2013.01)

(58) Field of Classification Search
None
See application file for complete search history.

(56) References Cited

U.S. PATENT DOCUMENTS

| | | | |
|---|---|---|---|
| 3,971,186 A | 7/1976 | Havelka et al. | |
| 4,318,157 A | 3/1982 | Rank et al. | |
| 4,480,287 A * | 10/1984 | Jensen | H05K 7/1404 361/707 |
| 4,775,260 A * | 10/1988 | Kecmer | F16B 2/14 361/801 |
| 4,909,752 A | 3/1990 | Hallum et al. | |
| 5,036,428 A * | 7/1991 | Brownhill | H05K 7/1404 361/721 |
| 5,859,764 A * | 1/1999 | Davis | H05K 7/1404 361/704 |
| 5,949,650 A * | 9/1999 | Bulante | H05K 7/20545 361/704 |
| 6,504,730 B1 * | 1/2003 | Cooney | H05K 7/1449 174/50 |

(Continued)

FOREIGN PATENT DOCUMENTS

EP 0505576 B1 7/1996

OTHER PUBLICATIONS

European Search Report for Application No. 19215232.0, dated Jul. 15, 2020, 6 pages.

*Primary Examiner* — James Wu
*Assistant Examiner* — Christopher L Augustin
(74) *Attorney, Agent, or Firm* — Cantor Colburn LLP

(57) ABSTRACT

A circuit card assembly for a vehicle chassis is provided. The circuit card assembly may include a circuit card unit, a wedge-lock retainer unit, and a support bracket. The circuit card unit has a printed circuit board (PCB) defining a first fastener aperture. The wedge-lock retainer unit may define a second fastener aperture. The support bracket includes first and second elements. The first element may define a third fastener aperture and the second element may define a fourth fastener aperture. The PCB, the wedge-lock retainer unit, and the support bracket may be arranged with one another such that the first fastener aperture, the second fastener aperture, and the third fastener aperture are aligned with one another and such that the fourth aperture is oriented in alignment with a chassis aperture of a chassis.

10 Claims, 5 Drawing Sheets

(56) References Cited

U.S. PATENT DOCUMENTS

| | | | |
|---|---|---|---|
| 7,345,877 B2 * | 3/2008 | Asfia | F28D 15/0266 361/700 |
| 7,483,271 B2 | 1/2009 | Miller et al. | |
| 9,814,169 B2 | 11/2017 | Mastrocola | |
| 9,839,116 B2 | 12/2017 | Kirk et al. | |
| 10,034,412 B2 | 7/2018 | Reid et al. | |
| 2006/0109631 A1 * | 5/2006 | Marro | H05K 7/20545 361/718 |
| 2010/0046170 A1 * | 2/2010 | Stevenson | H05K 7/1424 361/708 |
| 2010/0321890 A1 * | 12/2010 | Streyel | H05K 7/20545 361/704 |
| 2016/0353597 A1 * | 12/2016 | Gilmore | H05K 7/1404 |
| 2018/0183218 A1 * | 6/2018 | Pal | H05K 7/1404 |

\* cited by examiner

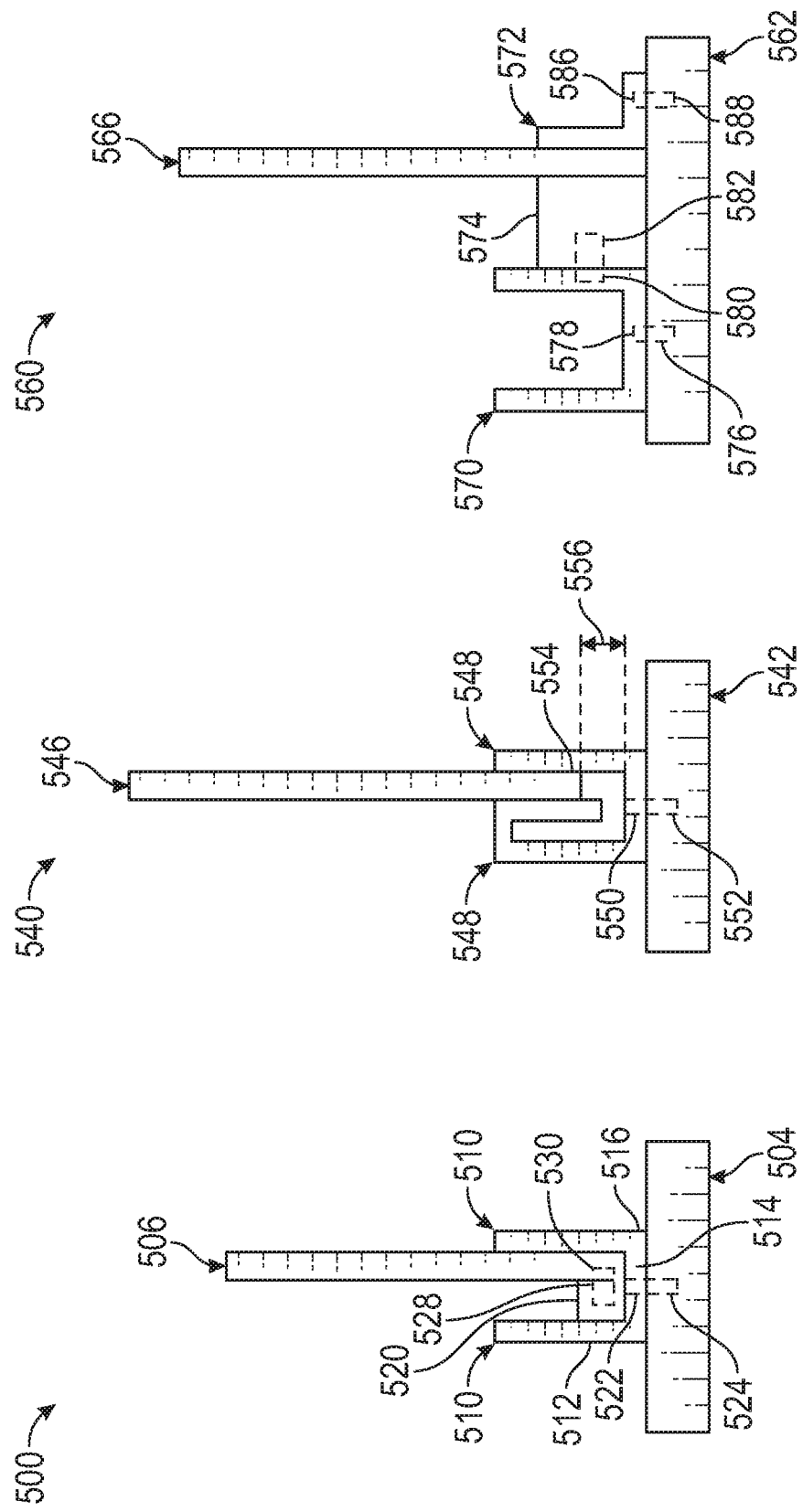

US 11,160,184 B2

VEHICLE CIRCUIT CARD ASSEMBLY

BACKGROUND

Exemplary embodiments pertain to the art of circuit card assemblies for vehicles. Depending on vibration, thermal, and weight constraints, circuit card assemblies are typically secured to a vehicle chassis using either a wedge-lock retainer or a friction card guide. A circuit card assembly that may operate for both scenarios requires significant structural changes to existing chassis designs and existing circuit card unit designs. It is desirable to provide a circuit card assembly that may operate using existing chassis apertures for friction card guides while minimizing design changes to a circuit card unit of the circuit card assembly and to minimize design changes to the vehicle chassis.

BRIEF DESCRIPTION

Disclosed is a circuit card assembly for a vehicle chassis. The circuit card assembly includes a circuit card unit, a wedge-lock retainer unit, and a support bracket. The circuit card unit has a printed circuit board (PCB) defining a first fastener aperture. The wedge-lock retainer unit defines a second fastener aperture. The support bracket includes first and second elements. The first element defines a third fastener aperture and the second element defining a fourth fastener aperture. The PCB, the wedge-lock retainer unit, and the support bracket are arranged with one another such that the first fastener aperture, the second fastener aperture, and the third fastener aperture are aligned with one another and such that the fourth aperture is oriented in alignment with a chassis aperture of a chassis.

In addition to the features described above, or as an alternative to any of the foregoing embodiments, the chassis aperture may be aligned with the fourth fastener aperture to secure the support bracket to the chassis via a fastener disposed within the fourth fastener aperture and the chassis aperture.

In addition to the features described above, or as an alternative to any of the foregoing embodiments, the chassis aperture may be located at a location to secure a friction card guide to the chassis.

In addition to the features described above, or as an alternative to any of the foregoing embodiments, the wedge-lock retainer unit may not be mounted adjacent an adapter structure or a support structure.

In addition to the features described above, or as an alternative to any of the foregoing embodiments, the first element of the support bracket may be arranged with the second element of the support bracket to define an L shape. The first element may be secured to the PCB and the second element may be secured to the chassis.

In addition to the features described above, or as an alternative to any of the foregoing embodiments, the chassis may be one of an aircraft chassis, an automobile chassis, and a boat chassis.

In addition to the features described above, or as an alternative to any of the foregoing embodiments, the chassis aperture may be an aperture to assist in facilitating a mechanical connection to a friction card guide.

Also disclosed is another circuit card assembly for a vehicle chassis. The circuit card assembly includes a circuit card unit, a wedge-lock retainer unit, and a support bracket. The circuit card unit has a PCB defining a first board aperture. The wedge-lock retainer unit defines a retainer aperture. The support bracket includes first and second elements. The first element defines a first support fastener aperture and the second element defines a second support aperture. The circuit card unit, the wedge-lock retainer unit, and the support bracket are arranged with one another such that the second support aperture aligns with a chassis aperture structured to facilitate a mechanical connection between the support bracket and a friction card guide.

In addition to the features described above, or as an alternative to any of the foregoing embodiments, the chassis aperture may be defined at a location for alignment with a friction card guide aperture.

In addition to the features described above, or as an alternative to any of the foregoing embodiments, the chassis aperture may be defined by a machined surface such that the wedge-lock retainer unit applies a force against the PCB toward the machined surface.

In addition to the features described above, or as an alternative to any of the foregoing embodiments, the circuit card unit, the wedge-lock retainer unit, and the support bracket may be further arranged with one another such that a lower surface of the PCB contacts a vehicle chassis defining the chassis aperture.

In addition to the features described above, or as an alternative to any of the foregoing embodiments, the wedge-lock retainer unit may not contact an adapter structure or a support structure when secured to the PCB.

In addition to the features described above, or as an alternative to any of the foregoing embodiments, the first element and the second element may be arranged with one another to define an L shape.

Also disclosed is yet another circuit card assembly for a vehicle chassis. The circuit card assembly includes a circuit card unit, a wedge-lock retainer unit, a support bracket, and a vehicle chassis. The circuit card unit has a PCB defining a first fastener aperture. The wedge-lock retainer unit defines a second fastener aperture. The support bracket includes first and second elements. The first element defines a third fastener aperture and the second element defines a fourth fastener aperture. The vehicle chassis defines a longitudinal axis, a lateral axis, and a chassis aperture to facilitate a mechanical connection with the support bracket via the fourth fastener aperture. The circuit card unit, the wedge-lock retainer unit, and the support bracket are arranged with one another such that the first fastener aperture, the second fastener aperture, and the third fastener aperture substantially share a central axis.

In addition to the features described above, or as an alternative to any of the foregoing embodiments, the fourth fastener aperture may be positioned at the location to align the fourth fastener aperture with a chassis mount aperture for a friction card guide.

In addition to the features described above, or as an alternative to any of the foregoing embodiments, each of the PCB, the wedge-lock retainer unit, and the support bracket may contact the vehicle chassis when secured to one another.

In addition to the features described above, or as an alternative to any of the foregoing embodiments, the wedge-lock retainer unit may not contact an adapter structure when secured to the PCB.

In addition to the features described above, or as an alternative to any of the foregoing embodiments, the first element of the support bracket may be arranged with the second element of the support bracket to define an L shape.

In addition to the features described above, or as an alternative to any of the foregoing embodiments, the chassis aperture may be an aperture to facilitate a mechanical connection with a friction card guide.

BRIEF DESCRIPTION OF THE DRAWINGS

The following descriptions should not be considered limiting in any way. With reference to the accompanying drawings, like elements are numbered alike:

FIG. 6A is a schematic diagram illustrating an example of a circuit card assembly for a vehicle;

FIG. 6B is a schematic diagram illustrating another example of a circuit card assembly for a vehicle;

FIG. 6C is a schematic diagram illustrating another example of a circuit card assembly for a vehicle;

DETAILED DESCRIPTION

A detailed description of one or more embodiments of the disclosed apparatus and method are presented herein by way of exemplification and not limitation with reference to the Figures.

The term "about" is intended to include the degree of error associated with measurement of the particular quantity based upon the equipment available at the time of filing the application.

Figure 1:
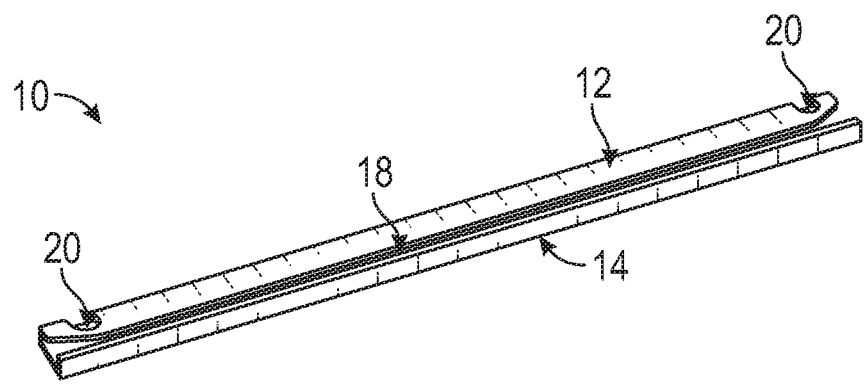
FIG. 1 is a perspective view of an example of a friction card guide for a vehicle.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof FIG. 1 is a perspective view of an example of a friction card guide for a vehicle, referred to generally as a friction card guide 10 herein. The friction card guide 10 may operate to retain a circuit card in a position within a vehicle. The friction card guide 10 includes a first portion 12 and a second portion 14. The first portion 12 and the second portion 14 are arranged with one another to define a card slot 18. The card slot 18 is sized to receive a portion of a circuit card unit (not shown in FIG. 1) such as a printed circuit board ("PCB"). The first portion 12 defines a pair of mount apertures 20. The friction card guide 10 is structured for mounting to a vehicle chassis using fasteners such as screws or rivets and the pair of mount apertures 20.

Figure 2:
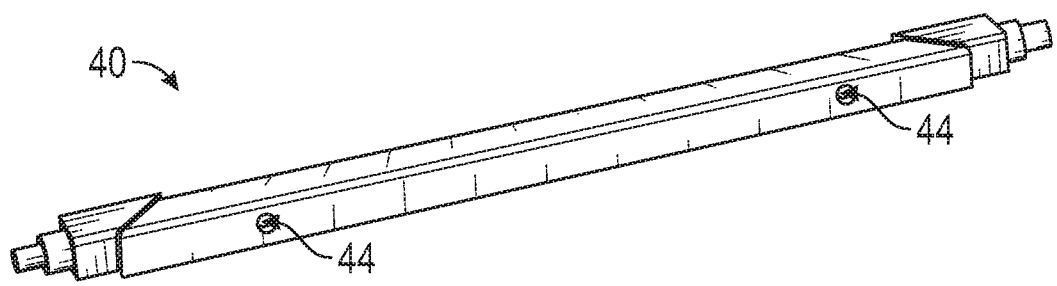
FIG. 2 is a perspective view of an example of a wedge-lock retainer for a vehicle.

FIG. 2 is a perspective view of an example of a wedge-lock retainer for a vehicle, referred to generally as a wedge-lock retainer 40 herein. The wedge-lock retainer 40 may operate to retain a circuit card in a position within a vehicle. The wedge-lock retainer 40 includes a pair of mount apertures 44. The wedge-lock retainer 40 is for mounting to a side of a circuit card unit (not shown in FIG. 2) and for mounting to a vehicle chassis such that a wedge of the wedge-lock retainer 40 applies a clamp load to the vehicle chassis. Usage of a wedge-lock retainer for a circuit card unit is different than a usage of a friction card guide for a circuit card unit. In an example using a wedge-lock retainer, the wedge-lock retainer is secured to a board of the circuit card unit and appropriate chassis structure is required to facilitate a slidable reception of the circuit card unit and to provide a surface for the wedge-lock retainer to push against.

Figure 3:
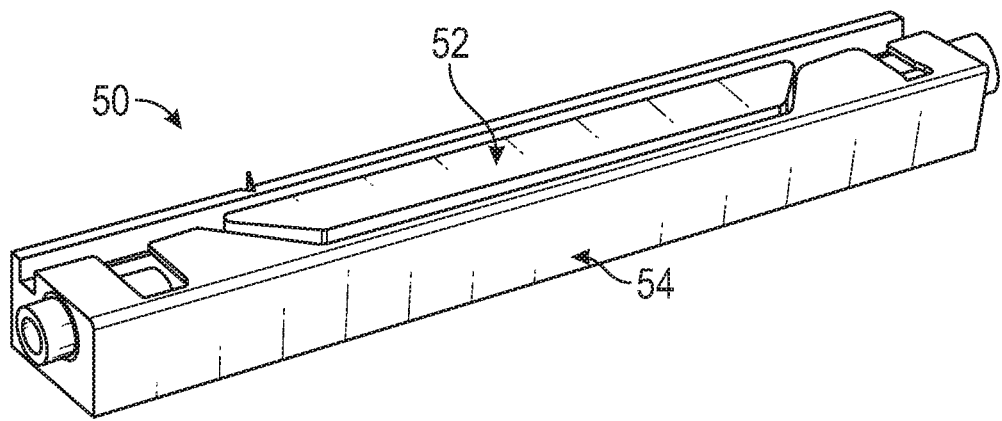
FIG. 3 is a perspective view of an example of a portion of a circuit card assembly for a vehicle.

FIG. 3 is a perspective view of another wedge-lock retainer, referred to generally as an assembly 50 herein. The assembly 50 includes a wedge-lock retainer 52 shown secured within a U-shaped chassis portion 54 in FIG. 3. The U-shaped chassis portion 54 may be formed with a vehicle chassis or formed as a separate unit and secured to a vehicle chassis.

Figure 4:
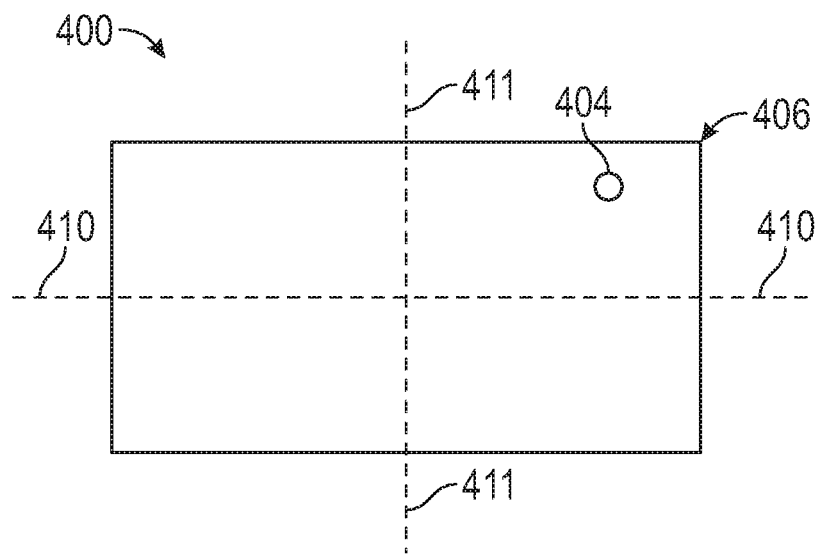
FIG. 4 is a schematic diagram illustrating an example of a vehicle.

FIG. 4 is a schematic diagram of a vehicle 400 including a receiving aperture 404 defined by a vehicle chassis 406. The vehicle 400 may be, for example, an aircraft, an automobile, or a watercraft. The vehicle 400 defines a central longitudinal axis 410 and a central latitudinal axis 411. The receiving aperture 404 may be spaced from the central longitudinal axis 410 and the central latitudinal axis 411 at distances coinciding with a typical placement of a friction card guide aperture in a vehicle. The receiving aperture 404 may be structured to facilitate securement of a friction card guide, such as the friction card guide 10 described above, to the vehicle chassis 406. Additionally, the receiving aperture 404 may be structured to facilitate securement of a circuit card assembly having a wedge-lock retainer unit to the vehicle chassis 406 according to the present disclosure. The receiving aperture 404 may also be referred to as a friction card guide aperture herein. In one example, the receiving aperture 404 may be defined by a machined surface such that a wedge-lock retainer unit applies a force against a PCB toward the machined surface.

Figure 5:
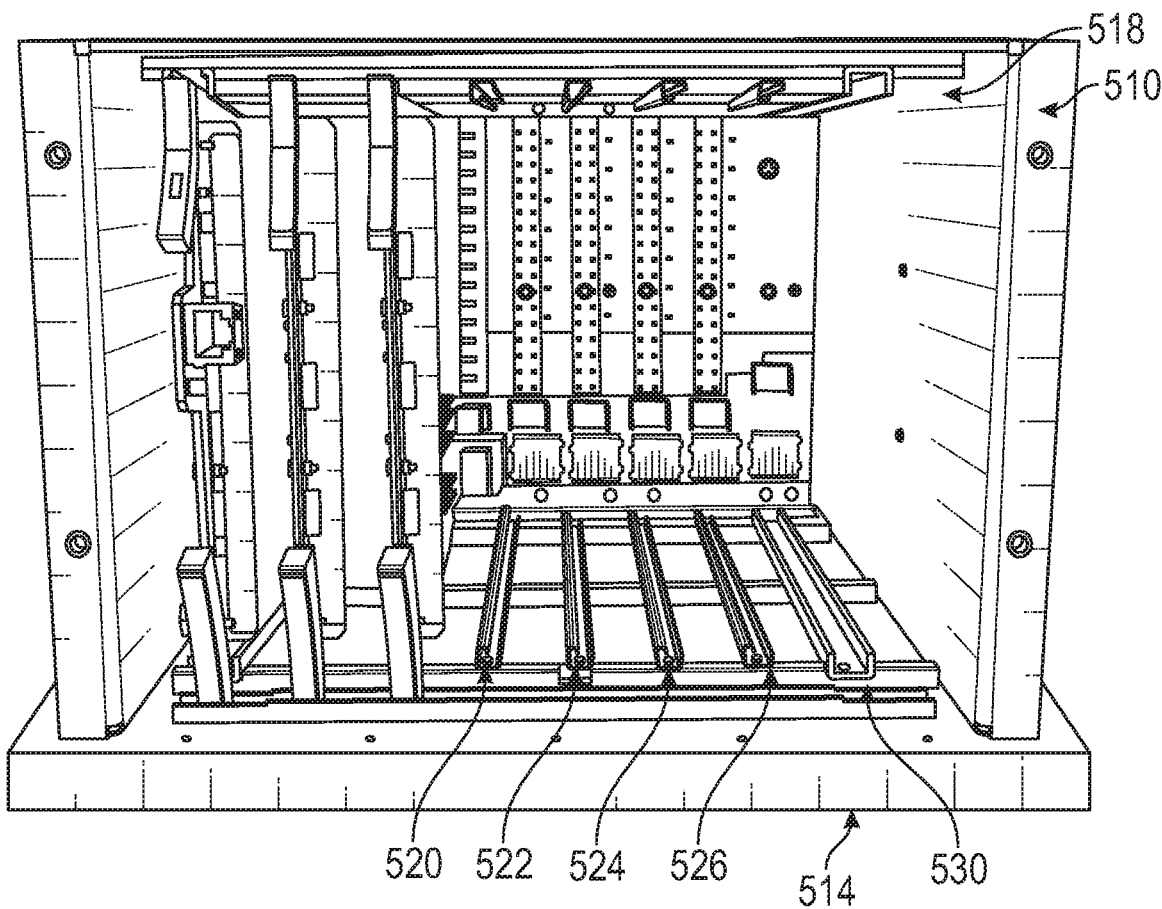
FIG. 5 is a perspective view of an example of a portion of a circuit card assembly and an example comparison between mounting scenarios of a friction card guide and a wedge-lock retainer.

FIG. 5 is a perspective view of an example of a circuit card assembly and an example comparison between mounting scenarios of a friction card guide and a wedge-lock retainer. In this example, a circuit card housing 510 is shown mounted to a portion of a vehicle chassis 514. The circuit card housing 510 defines a cavity 518 sized to house a plurality of circuit card assemblies. For example, a first friction card guide 520, a second friction card guide 522, a third friction card guide 524, and a fourth friction card guide 526 are shown mounted to the circuit card housing 510. Additionally, a portion of a wedge-lock retainer unit 530 is shown mounted to the circuit card housing 510. The circuit card housing 510 may include one or more apertures to facilitate securement of the circuit card housing 510 to the vehicle chassis 514. For example, the one or more apertures may be defined by the circuit card housing 510 at a location for alignment with a friction card guide aperture defined by the vehicle chassis 514.

FIGS. 6A through 6C are schematic diagrams illustrating examples of circuit card assemblies for vehicles. In FIG. 6A, a circuit card unit 500 is shown mounted to a portion of a vehicle chassis 504. The circuit card unit 500 includes a PCB 506. An adapter structure 510 includes a first element 512, a second element 514, and a third element 516 arranged with one another to define a horseshoe-shaped profile as shown in FIG. 6A. The adapter structure 510 is sized to receive a portion of the PCB 506 and a wedge-lock retainer unit 520 within a cavity defined by the first element 512, the second element 514, and the third element 516 such that neither of the PCB 506 or the wedge-lock retainer unit 520 directly contact the portion of the vehicle chassis 504.

In this example, the adapter structure 510 defines an adapter aperture 522 and the portion of the vehicle chassis 504 defines a chassis aperture 524. The adapter structure 510 is secured to the portion of the vehicle chassis 504 via a fastener disposed within the adapter aperture 522 and the chassis aperture 524. The wedge-lock retainer unit 520 defines a retainer aperture 528 and the PCB 506 defines a PCB aperture 530. The retainer aperture 528 and the PCB aperture 530 are aligned with one another such that a fastener may secure the wedge-lock retainer unit 520 to the PCB 506.

In FIG. 6B, a circuit card unit 540 is shown mounted to a portion of a vehicle chassis 542. The circuit card unit 540 includes a PCB 546. A friction card guide 548 is sized to receive a portion of the PCB 546 such that no portion of the PCB 546 directly contacts the portion of the vehicle chassis 542. In this example, the friction card guide 548 defines a guide aperture 550 and the portion of the vehicle chassis 542 defines a chassis aperture 552. The friction card guide 548 is secured to the portion of the vehicle chassis 542 via a fastener disposed within the guide aperture 550 and the chassis aperture 552. The friction card guide 548 defines a slot 554 to receive the PCB 546. However, a structure of the friction card guide 548 is such that a space is defined between the PCB 546 and the friction card guide 548 as represented by dimension 556 in FIG. 6B.

In FIG. 6C, a circuit card unit 560 is shown mounted to a portion of a vehicle chassis 562. The circuit card unit 560 includes a PCB 566. An adapter structure 570 is spaced from a support structure 572 to define a space to receive a portion of the PCB 566 and a wedge-lock retainer unit 574.

The vehicle chassis 562 defines a first chassis aperture 576 and the adapter structure 570 defines a first adapter aperture 578. The first chassis aperture 576 is aligned with the first adapter aperture 578 to facilitate a mechanical connection to secure the adapter structure 570 to the vehicle chassis 562. The adapter structure 570 further defines a second adapter aperture 580. The wedge-lock retainer unit 574 defines a retainer aperture 582 aligned with the second adapter aperture 580 to facilitate a mechanical connection to secure the adapter structure 570 to the wedge-lock retainer unit 574.

The support structure 572 defines a support aperture 586 for aligning with a second chassis aperture 588 to facilitate a mechanical connection to secure the support structure 572 to the vehicle chassis 562.

Figure 7A:
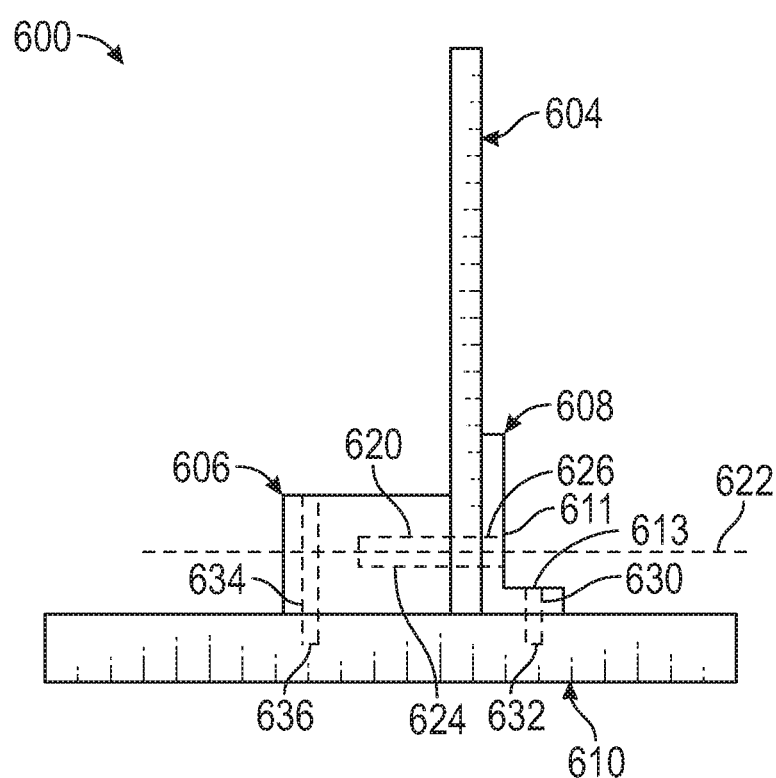
FIG. 7A is a schematic diagram illustrating an example of a circuit card assembly for a vehicle according to an embodiment of the present disclosure.

FIG. 7A is a schematic diagram of an embodiment of a circuit card assembly according to the present disclosure, referred to generally as a circuit card assembly 600 herein.

The circuit card assembly 600 may operate to retain a PCB in a position within a vehicle. For example, the circuit card assembly 600 may be secured to a vehicle chassis using an existing chassis aperture designed for securing a friction card guide to the vehicle chassis. Additionally, the circuit card assembly 600 may operate with fewer components than the previous assemblies, such as the assemblies described in relation to FIGS. 6A through 6C.

The circuit card assembly 600 may include a PCB 604, a wedge-lock retainer unit 606, and a support structure 608. The circuit card assembly 600 may be mounted to a vehicle chassis 610. Those skilled in the art will understand that the circuit card assembly 600 may be used with various types of vehicles including aircraft, automobiles, boats, and the like, without departing from a scope of the present disclosure.

The support structure 608 may include a first element 611 and a second element 613. The first element 611 and the second element 613 may be arranged with one another to define an L shape. The PCB 604 may include a through-hole 620 defining a central through-hole axis 622. While the through-hole 620 is shown as extending completely through the PCB 604 in FIG. 7A, it is contemplated that the through-hole 620 may be replaced with a pair of bores, each extending partially into the PCB 604 and each aligned with an aperture of one of the wedge-lock retainer unit 606 and the support structure 608 to facilitate a mechanical connection.

For example, the wedge-lock retainer unit 606 may define a first retainer aperture 624 and the support structure 608 may define a first support aperture 626. Each of the through-hole 620, the first retainer aperture 624, and the first support aperture 626 may be partially or fully threaded to facilitate receipt of a fastener to secure components of the circuit card assembly 600 to one another. Each of the first retainer aperture 624 and the first support aperture 626 may define a central axis substantially the same as the central through-hole axis 622 such that one or more fasteners may secure the wedge-lock retainer unit 606 to the PCB 604 and secure the support structure 608 to the PCB 604.

The support structure 608 may further define a second support aperture 630 aligned with a first chassis aperture 632 to facilitate a mechanical connection between the support structure 608 and the vehicle chassis 610 via a fastener. The wedge-lock retainer unit 606 may further define a second retainer aperture 634 aligned with a second chassis aperture 636.

In this example, the PCB 604, the wedge-lock retainer unit 606, and the support structure 608 may be arranged with one another such that the through-hole 620, the first retainer aperture 624, and the first support structure aperture 626 are aligned with one another and such that the second support aperture 630 is aligned with the first chassis aperture 632. The alignment of the second support aperture 630 and the first chassis aperture 632 assists in securing the support bracket 608 to the vehicle chassis 610. The first chassis aperture 632 may be an aperture defined by the vehicle chassis 610 to facilitate a mechanical connection with a friction card guide, such as the friction card guide 10 described in relation to FIG. 1.

The PCB 604, the wedge-lock retainer unit 606, and the support structure 608 may be further arranged with one another such that a lower surface of the PCB 604 contacts the vehicle chassis 610 when the support structure 608 is secured to the PCB 604 and the vehicle chassis 610. Additionally, each of the PCB 604, the wedge-lock retainer unit 606, and the support structure 608 contact the vehicle chassis 610 when secured to one another.

Further, in this example the wedge-lock retainer unit 606 may be mounted at a location not adjacent to an adapter structure and/or not adjacent to the support structure 608 as shown in FIG. 7A.

Figure 7B:
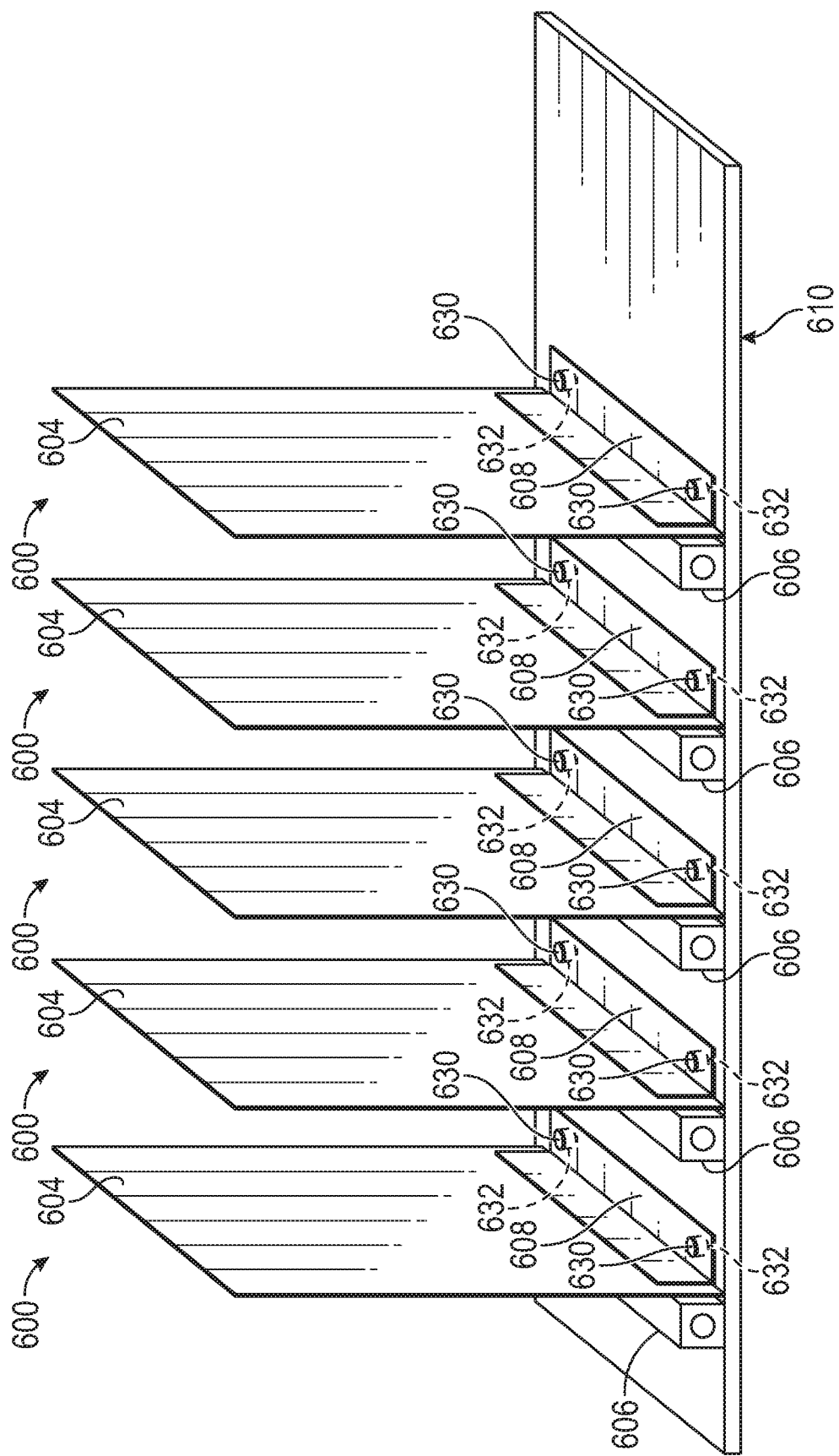
FIG. 7B is a schematic diagram illustrating an example of a configuration of five of the circuit card assemblies of FIG. 7A.

FIG. 7B is a schematic diagram illustrating an example of a configuration of five of the circuit card assemblies 600 of FIG. 7A mounted to the vehicle chassis 610. In this example, each of the circuit card assemblies 600 may be mounted to the vehicle chassis 610 via, for example, an aperture structured to assist in mounting a friction card guide to the vehicle chassis 610, such as the first chassis aperture 632 or the second chassis aperture 636 discussed in relation to FIG. 7A.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A circuit card assembly for a vehicle chassis comprising:
    a circuit card unit having a printed circuit board (PCB) defining a first fastener aperture;
    a wedge-lock retainer unit defining a second fastener aperture; and
    a support bracket including first and second elements, the first element defining a third fastener aperture and the second element defining a fourth fastener aperture,
    wherein the PCB, the wedge-lock retainer unit, and the support bracket are arranged with one another such that the first fastener aperture, the second fastener aperture, and the third fastener aperture are aligned with one another and such that the fourth aperture is oriented in alignment with a chassis aperture of a chassis.

2. The assembly of claim 1, wherein the chassis aperture is aligned with the fourth fastener aperture to secure the support bracket to the chassis via a fastener disposed within the fourth fastener aperture and the chassis aperture.

3. The assembly of claim 2, wherein the chassis aperture is structured to assist in mounting a friction card guide to the chassis.

4. The assembly of claim 1, wherein the wedge-lock retainer unit is not mounted adjacent an adapter structure.

5. The assembly of claim 1, wherein the first element of the support bracket is arranged with the second element of the support bracket to define an L shape, and wherein the first element is secured to the PCB and the second element is secured to the chassis.

6. The assembly of claim 1, wherein the chassis is one of an aircraft chassis, an automobile chassis, and a boat chassis.

7. The assembly of claim 1, wherein the chassis aperture is structured to assist mounting a friction card guide to the chassis.

8. A circuit card assembly for a vehicle chassis comprising:
    a circuit card unit having a printed circuit board (PCB) defining a first fastener aperture;
    a wedge-lock retainer unit defining a second fastener aperture; and
    a support bracket including first and second elements, the first element defining a third fastener aperture and the second element defining a fourth fastener aperture; and
    a vehicle chassis defining a longitudinal axis, a lateral axis, and a chassis aperture defined at a location to facilitate a mechanical connection with the support bracket via the fourth fastener aperture,
    wherein the circuit card unit, the wedge-lock retainer unit, and the support bracket are arranged with one another such that the first fastener aperture, the second fastener aperture, and the third fastener aperture substantially share a central axis.

9. The assembly of claim 8, wherein each of the PCB, the wedge-lock retainer unit, and the support bracket contact the vehicle chassis when secured to one another.

10. The assembly of claim 8, wherein the first element of the support bracket is arranged with the second element of the support bracket to define an L shape.

\* \* \* \* \*